US008053331B2

(12) United States Patent
Gadkaree

(10) Patent No.: US 8,053,331 B2
(45) Date of Patent: Nov. 8, 2011

(54) FLEXIBLE DISPLAY SUBSTRATES

(75) Inventor: Kishor P. Gadkaree, Big Flats, NY (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 12/643,501

(22) Filed: Dec. 21, 2009

(65) Prior Publication Data

US 2010/0099237 A1 Apr. 22, 2010

Related U.S. Application Data

(62) Division of application No. 11/393,483, filed on Mar. 29, 2006, now abandoned.

(60) Provisional application No. 60/674,983, filed on Apr. 25, 2005.

(51) Int. Cl.
*H01L 21/30* (2006.01)

(52) U.S. Cl. ........ 438/458; 438/149; 438/459; 438/479; 257/E21.568; 257/E21.57

(58) Field of Classification Search ................... 438/458, 438/459, 149, 153, 154, 479, 455, 456, 977; 257/E21.568, E21.57
See application file for complete search history.

(56) References Cited

U.S. PATENT DOCUMENTS

| | | | | |
|---|---|---|---|---|
| 5,374,564 | A | 12/1994 | Bruel | 437/24 |
| 5,854,123 | A | 12/1998 | Sato et al. | 438/507 |
| 6,372,608 | B1 | 4/2002 | Shimoda et al. | 438/455 |
| 6,378,635 | B1 | 4/2002 | Yoshida et al. | 189/9.5 |
| 6,544,430 | B2* | 4/2003 | McCormack et al. | 216/67 |
| 6,680,724 | B2 | 1/2004 | Lichtfuss | 345/102 |
| 6,696,325 | B1 | 2/2004 | Tsai et al. | 438/149 |
| 6,710,841 | B2 | 3/2004 | Tsang et al. | 349/158 |
| 2002/0113548 | A1 | 8/2002 | Silvernail | 313/506 |
| 2002/0176993 | A1 | 11/2002 | Graff et al. | 428/412 |
| 2003/0077885 | A1* | 4/2003 | Aspar et al. | 438/517 |
| 2003/0224582 | A1 | 12/2003 | Shimoda et al. | 438/458 |
| 2004/0171232 | A1 | 9/2004 | Cayrefourcq et al. | 438/458 |
| 2004/0224482 | A1* | 11/2004 | Kub et al. | 438/458 |
| 2004/0229444 | A1* | 11/2004 | Couillard et al. | 438/455 |
| 2006/0170077 | A1* | 8/2006 | Aoki et al. | 257/642 |

OTHER PUBLICATIONS

M. Bruel, "Silicon on insulator material technology", Electronics Letters, Jul. 6, 1995; vol. 31, No. 14, pp. 1201-1202.
L. Di Cioccio et al., "Silicon carbide on insulator formation using the Smart Cut process", Electronics Letters, Jun. 6, 1996, vol. 32, No. 12, pp. 1144-1145.
D.Y. Khang et al., "A stretchable form of single-crystal silicon for high-performance electronics on rubber substrates", Science, Jan. 13, 2006, vol. 311, pp. 208-212.
M. Bister et al., "Ranges of the 0.3-2 MeV $H^+$ and 0.7-2 MeV $H_2^+$ Ions in Si and Ge", Radiation Effects, 1982, vol. 59, p. 199-202.
M. Bruel, "Smart-Cut: A new Silicon on Insulator Material Technology Based on Hydrogen Implantation and Wafer Bonding", Jpn. J. Appl. Phys. vol. 36 (1997) pp. 1639-1941.

* cited by examiner

*Primary Examiner* — Julio J Maldonado
(74) *Attorney, Agent, or Firm* — Bruce P. Watson

(57) ABSTRACT

Processes for transferring a semiconductor material to a polymer substrate to provide flexible semiconductor material include implanting ions to a predetermined depth in a semiconductor substrate, heat-treating the ion-implanted semiconductor substrate for a period of time and at a temperature effective to cause defect formation and enlargement of the implanted ion defect, adhering the ion-implanted, heat-treated substrate to a polymer substrate, and separating a semiconductor film such as a single crystal silicon film from the semiconductor substrate; and devices having single crystal silicon films disposed directly or indirectly on polymer films.

28 Claims, 3 Drawing Sheets

FLEXIBLE DISPLAY SUBSTRATES

CROSS-REFERENCE TO RELATED APPLICATIONS

This application is a Divisional of and claims the benefit of priority to U.S. patent application Ser. No. 11/393,483, filed on Mar. 29, 2006 now abandoned, the content of which is relied upon and incorporated herein by reference in its entirety.

This application claims the benefit of U.S. application Ser. No. 60/674,983, filed Apr. 25, 2005 and entitled "Flexible Display Substrates" which is incorporated by reference herein.

BACKGROUND OF THE INVENTION

The present invention relates to thin film semiconductors, and in particular, to methods of making thin film semiconductors having a polymer substrate, and structures having a single crystal silicon film and polymer substrate.

There is a growing need for a variety of display devices, such as liquid crystal display (LCD), organic light emitting diode (OLED), and active matrix liquid crystal display (AMLCD) devices. These display devices are based on technology using thin-film semiconductor material. The thin-film semiconductor material is used to produce thin-film transistors (TFT), three-terminal devices in which an input signal controls the output current. TFTs are classified into those using polycrystalline silicon (poly-Si), amorphous silicon, or single crystal silicon (SCS) thin-film semiconductor material. TFTs perform switching and amplifying functions and can operate as a discrete device or as a building cell of integrated circuits. For example, an LCD device uses an array of TFTs to control the display process. In OLED devices, radiation is emitted as a result of electron-hole interactions in thin film organic semiconductors. An AMLCD device is a higher performance version of an LCD and uses an array of TFTs to control individual pixels.

TFTs made using amorphous silicon must be driven by standard integrated circuits. Amorphous silicon is a non-crystalline silicon possessing no long-range crystallographic order. As a result, amorphous silicon films possess poor electrical characteristics and inherently poor stability. Amorphous silicon film is suitable for producing transistors to switch individual pixels on and off, but is unable to handle logic and mixed signal functions needed for higher performance devices.

TFTs produced using poly-Si technology are superior to those made with amorphous silicon. Poly-Si is a crystalline silicon in which atoms are arranged following a specific pattern (long-range order) within limited grains. While this emerging technology is expected to eliminate the need for separate display drivers, required with TFTs made of amorphous silicon, and allow fabrication of drivers on poly-Si itself, and reduce the cost and size of display devices, poly-Si technology has been under development for several years and has yet to solve issues of poor uniformity and high cost of manufacture.

The use of SCS films creates superior electronic and photonic properties as compared to amorphous silicon and poly-Si films. SCS is a crystalline solid in which long-range order exists throughout the entire piece of material, significantly enhancing low-charge-carrier mobility. Also, the single crystal nature of the film provides better uniformity than amorphous silicon or poly-Si films.

Processes for transferring SCS film onto an oxidized substrate are known in the art. Exfoliation is one such technique. Exfoliation by the hydrogen ion implantation method generally involves implanting a silicon wafer with ions to create a defect structure in the wafer. Typically, the implantation ions are hydrogen ions. The ion-implanted side of the wafer is then brought into contact with an oxidized silicon substrate. The wafer and oxidized silicon substrate are heated to high temperatures, typically greater than 1,000° C. The heat treatment forms a bond between the ion-implanted side of the silicon wafer and the oxidized silicon substrate. The heat also causes the ion-implanted portion of the silicon wafer to separate from the silicon wafer.

Since processes for obtaining an SCS film on a substrate require relatively high temperatures, they are not suitable for polymer substrates. Consequently, most TFTs used in display devices are made using glass substrates. However, glass substrates result in significant weight of display devices due to the high density of glass employed therein. Also, glass substrates are rigid and possess a low tolerance for bending stresses. Moreover, glass is fragile and if dropped, TFTs made with glass substrates have a high risk of breakage.

Many applications require lightweight, flexible displays. There are many polymer materials that are much more flexible than glass and have less than about half the density of glass. As a result, some effort has been made to develop technology to replace glass substrates with polymer substrates. These technologies employ either amorphous silicon or poly-Si film transferred to a polymer substrate and are subject to the aforementioned drawbacks. Accordingly, there is a need in the art for devices employing SCS film on a polymer substrate.

SUMMARY OF THE INVENTION

The present invention provides processes for producing semiconductor on insulator structures comprising transferring a semiconductor film to a polymer substrate to make a flexible semiconductor material. Such processes involve in one embodiment implanting ions in a region of predetermined depth in a semiconductor donor wafer, heat-treating the implanted semiconductor donor wafer on a support substrate for a period of time and at a temperature effective to cause defect formation in the region of implanted ions and delaminating a thin film of semiconductor from the donor wafer onto a polymer substrate.

In one embodiment, an ion-implanted, heat-treated semiconductor donor wafer is adhered to a polymer substrate and a SCS film is separated from the semiconductor donor wafer. In accordance with one embodiment, the silicon donor wafer is a SCS wafer.

The processes of the present invention include steps of transferring a substantially uniform film with enhanced low-charge carrier mobility onto a polymer substrate to form a semiconductor structure that is flexible, lightweight, and more resistant to breakage. Processes in accordance with the present invention do not require the use of high temperatures or oxidized silicon layers.

In accordance with one embodiment, the invention provides a method for producing a semiconductor-on-insulator structure, specifically, a semiconductor on polymer structure, comprising the steps of providing first and second substrates wherein the first substrate comprises a first external surface for bonding to the second substrate (the first bonding surface), a second external surface for applying force to the first substrate (the first force-applying surface), and an internal zone for separating the first substrate into a first part and a second part (the internal zone is hereinafter referred to as the "separation zone," which, for example, can be a hydrogen ion implantation zone), wherein the first bonding surface, the first force-applying surface and the separation zone are substantially parallel to one another. Further, the second part is between the separation zone and the first bonding surface and the first substrate comprises a semiconductor material.

The first substrate is subjected to a heat treatment to facilitate later delamination of the second part and then cooled. Heat treatment may take place on a substrate such as a glass substrate.

The second substrate comprises two external surfaces, one for bonding to the first substrate (the second bonding surface) and another for applying force to the second substrate (the second force-applying surface), wherein the second bonding surface and the second force-applying surface are separated from one another by a distance $D_2$ and the second substrate comprises a polymer.

The second substrate is heated. The first and second bonding surfaces are brought into contact (once brought into contact, the first and second bonding surfaces form what is referred to herein as the "interface" between the first and second substrates) for a period of time sufficient for the first and second substrates to bond to one another at the first and second bonding surfaces (i.e., at the interface), under conditions in which force is applied to the first and second force-applying surfaces to press the first and second bonding surfaces together. After a suitable period of time, the heat to the second substrate is discontinued and the assembly is cooled to a common temperature such as room temperature. The pressure is removed and first and second parts are separated at the separation zone. The first and second substrates are believed to undergo differential contraction to facilitate separation at the separation zone.

The present invention also provides improved semiconductor on insulator structures. In one embodiment the present invention comprises a SCS film and polymer substrate joined to one another either directly or through one or more intermediate layers.

It is to be understood that the foregoing description is exemplary of the invention only and is intended to provide an overview for the understanding of the nature and character of the invention as it is defined by the claims. The accompanying drawings are included to provide a further understanding of the invention and are incorporated and constitute part of this specification. The drawings illustrate various features and embodiments of the invention which, together with their description serve to explain the principles and operation of the invention.

DETAILED DESCRIPTION OF THE PREFERRED EMBODIMENT

A more detailed description of embodiments of the present invention is described in conjunction with the drawings. In the following description, for purposes of explanation, specific numbers, materials and configurations are set forth in order to provide a thorough understanding of the invention. It will be apparent, however, to one having ordinary skill in the art, that the invention may be practiced without these specific details. In some instances, well-known features may be omitted or simplified so as not to obscure the present invention. Furthermore, reference in the specification to "one embodiment" or "an embodiment" means that a particular feature, structure or characteristic described in connection with the embodiment is included in at least one embodiment of the invention. The appearances of the phrase "in an embodiment" in various places in the specification are not necessarily all referring to the same embodiment.

In accordance with a first embodiment FIGS. 1-4 depict structures employed in processes of the present invention.

Figure 1:
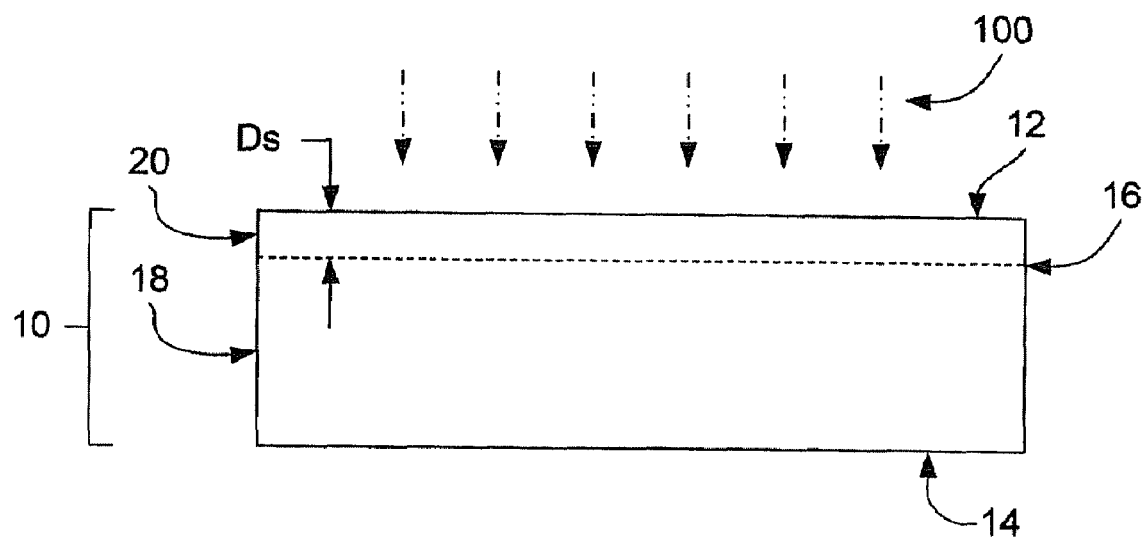
FIG. 1 is a cross-sectional view of a semiconductor substrate which is exposed to bombardment of ions to produce a layer of implanted ions.

Now referring to FIG. 1 a first substrate 10 is disclosed. Substrate 10 may comprise a semiconductor material. The semiconductor material of substrate 10 can be a silicon-based semiconductor or any other type of semiconductor, such as, the III-V, II-IV, II-IV-V, etc. classes of semiconductors. Examples of silicon-based materials which can be used for the first substrate 10 include silicon (Si), germanium-doped silicon (SiGe), and silicon carbide (SiC) materials. Examples of other semiconductors which can be employed for the first substrate include Ge, GaAs, GaP, and InP materials. In one embodiment, the semiconductor of the first substrate 10 is in the form of a substantially single-crystal ("SCS") material. The word "substantially" is used in describing the first substrate 10 to take account of the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

The first substrate 10 has a first external surface 12 comprising a bonding surface, a second external surface comprising a force-applying surface, and an internal separation zone 16 for separating the first substrate into a first part 18 and a second part 20, the thickness of the second part 20 being $D_s$. Total thickness of first substrate 10 will typically be in the range of 100-1000 microns, with thicknesses in the range of between about 300-700 microns in certain embodiments. $D_s$ will typically be in the range of about 0.05 microns to about 100 microns, with thicknesses being in the 0.05 micron to 10 micron range in certain embodiments. The second part 20 can be thinner than 0.05 microns, although excessively thin semiconductor layers will generally not provide sufficient material for the production of semiconductor devices. Thinner semiconductor layers may be created via oxidation or other methods known in the art.

In one embodiment, external surfaces 12 and 14 and separation zone 16 are parallel to one another. However, to take account of the fact that there may be some slight angle, e.g., up to 1-2 degrees, between one or more of the surfaces and/or the zone, the surfaces 12 and 14 and zone 16 are described herein as being preferably "substantially parallel" which includes both the completely parallel and slightly angled cases. The phrase "substantially parallel" also includes the possibility that one or more of the surfaces 12 or 14 or the zone 16 may not be completely flat.

Separation zone 16 may be formed using implantation techniques of the type currently known to those skilled in the art or which may be developed in the future. At present, the separation zone 16 is formed using the hydrogen ion implantation techniques discussed above. Other currently-known techniques can also be used to form the separation zone 16, such as, co-implantation of hydrogen and helium ions or hydrogen and boron ions. Whatever technique is chosen, the first substrate 10 needs to be separable into the first part 18 and second part 20 at the separation zone 16. Thus, the separation zone 16 needs to respond to the heat treatment/cooling process discussed hereinbelow by becoming weaker so that the division of the first substrate 10 into the first part 18 and second part 20 can occur.

Ion implantation is achieved by bombarding surface 12 with hydrogen, helium or other noble gas ions 100. The ion combination may be used to facilitate thin film separation or to reduce ion dosages. In one embodiment, hydrogen ion implantation is utilized. Hydrogen ion implantation into the silicon wafer 10 creates a defect formation layer 30 containing imperfections of the crystallographic structure in the wafer. The depth of the defect layer 30 is controlled by the implantation dose. The implantation dose is defined as the number of ions crossing one centimeter squared of the surface of the implanted solid and is controlled by the ion beam current and implantation time. In one embodiment, the ion beam current is from about 10 KeV to about 200 KeV, in another embodiment from about 60 KeV to about 150 KeV, and in yet another embodiment is about 100 KeV. In one embodiment, the implantation dose is from about $1 \times 10^{16}$ ions/cm$^2$ to about $3 \times 10^{17}$ ions/cm$^2$, in another embodiment from about $3 \times 10^{16}$ ions/cm$^2$ to about $12 \times 10^{16}$ ions/cm$^2$, and in yet another embodiment from about $8 \times 10^{16}$ ions/cm$^2$ to about $9 \times 10^{16}$ ions/cm$^2$.

Figure 2:
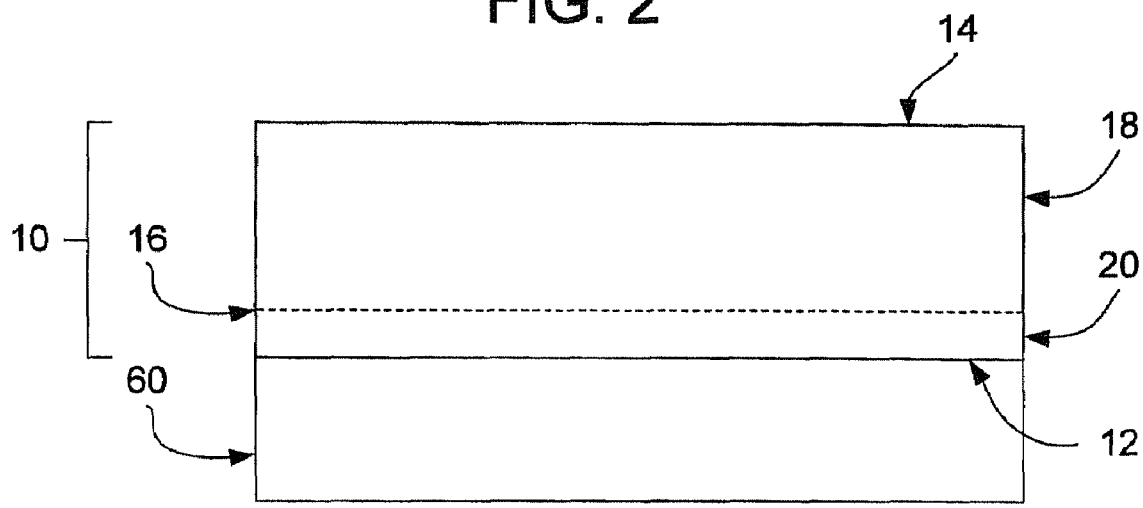
FIG. 2 is a cross-sectional view of the ion-implanted substrate shown in FIG. 1 placed on a support.

Now referring to FIG. 2, the ion-implanted substrate 10 is shown disposed on a support 60. The implanted side (first external surface 12) of the substrate 10 is placed on the support 60 such that the surface 12 is in contact with the support 60. In one embodiment, the support 60 is rigid and capable of withstanding temperatures above 500° C. without deformation (e.g. smooth high strain point glass). The ion-implanted substrate 10 is heat-treated for a period of time and at a temperature effective to cause defect formation and enlargement of the implanted ions in separation zone 16. In one embodiment, the heat treatment temperature ranges from about 300° C. to about 500° C., and can further range from about 400° C. to about 500° C.; and in yet another embodiment is about 450° C. The heat treatment may be sustained for a time in the range of about one minute to about 120 minutes, and can further range from about 30 minutes to about 90 minutes, and in yet another embodiment the heat treatment is sustained for about 60 minutes. The heat-treated substrate 10 is then allowed to cool to about room temperature. Heat treatment does not cause the first part 20 of substrate 10 to separate from the second part 18. Now referring to FIG. 3, heat treating the substrate 10 causes implanted ion defects 16a in the separation zone 16 to enlarge.

Figure 3:
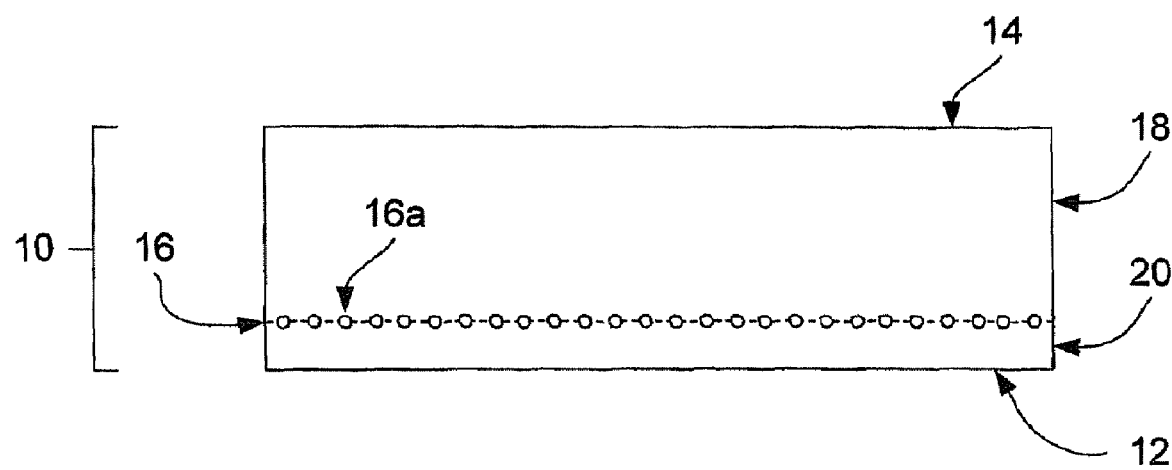
FIG. 3 is a cross-sectional view of a heat-treated ion-implanted substrate and a second substrate.
Figure 3:
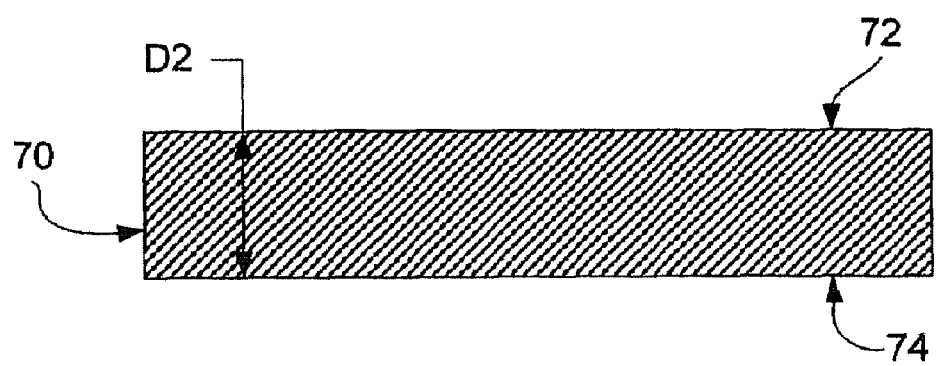

FIG. 3 shows the heat-treated ion-implanted substrate 10 and a second substrate 70. Second substrate comprises a bonding surface 72 and a force-applying surface 74. Bonding surface 72 and the force-applying surface 74 are separated from one another by a distance $D_2$. Surfaces 72 and 74 may be substantially parallel to one another. In order to ensure that the SOI structure has uniform properties in, for example, the radial direction for a circular wafer, e.g., uniform bonding strength at the interface between the first and second substrates 10 and 70, any deviations from parallel of external surfaces 12, 14, 72, and 74 and separation zone 16 will advantageously be kept to a minimum. Notwithstanding the foregoing, it will be apparent to those having skill in the art that deviations from parallel may be tolerated as long as uniform bonding strength at the interface can be achieved.

As shown in FIG. 3, the second substrate 70 has a thickness $D_2$, which may be in the range of 0.1 mm to 10 mm in one embodiment and in the range of 0.5 mm to 1 mm in another embodiment. It will be appreciated that the thickness of the second substrate 70 may be as low as about 1 micron in some embodiments. In general terms, the second substrate 70 should be thick enough to support the first substrate 10 through the process steps of the invention, as well as any subsequent processing that may be performed on the SOI structure 90, which structure 90 is discussed below. There is no theoretical upper limit on the thickness of the second substrate 70, but as thickness increases, flexibility of the overall substrate may decrease.

The second substrate 70 may comprise a polymer. Thermoplastic polymers, glass-polymer blends, and polymers coated with a glass film are most typically used as the polymer substrate 70, but thermoset polymers with high failure strain may also be used. Examples of polymers suitable for use in the present invention include polysulfone, polyethylene terephthalate (PET), polyethylene naphthalate (PEN), polyimides, polyolefins, polyvinylchloride, polyvinylidene chloride, polystyrene, polyamides, polyamide-imides, polycarbonates, acrylic resins, polymethylmethacrylate (PMMA), acrylonitrile-butadiene-styrene copolymers (ABS resins), acrylonitrile-styrene copolymers, butadiene-styrene copolymers, polyoxymethylene, polyvinyl alcohol (PVA), polyesters, polyethers, polyethylene, polypropylene, ethylene-propylene copolymers, and ethylene-vinyl acetate copolymers (EVAs); cyclic polyolefins; modified polyolefins; poly-(4-methylpentene-1); ionomers; ethylene-vinyl alcohol copolymers (EVOHs); polybutylene terephthalate (PBT), and polycyclohexane terephthalate (PCT); polyether-ketones (PEKs); polyether-ether-ketone (PEEKs); polyether-imides; polyacetals (POMs); polyphenylene oxides; modified polyphenylene oxides; polyphenylene sulfide (PPS); polyether sulfones (PESs); polyarylates; aromatic polyesters (liquid crystal polymers); polytetrafluoroethylene; polyvinylidene fluoride; other fluorine resins; thermoplastic elastomers, e.g., styrene-, polyolefin-, polyvinyl chloride-, polyurethane-, polyester-, polyamide-, polybutadiene-, trans-polyisoprene-, fluorine rubber-, and chlorinated polyethylene-type; epoxy resins; phenol resins; urea resins; melamine resins; unsaturated polyesters; silicone resins; and polyurethanes; and copolymers, blends, and polymer alloys essentially consisting of these synthetic resins. The polymer substrates may be produced by extrusion, pressing, or solution casting.

For certain applications, e.g., display applications, the second substrate 70 is transparent in the visible, near UV, and/or IR wavelength ranges, e.g., transparent in the 350 nm to 2 micron wavelength range.

In another embodiment, substrates 70 composed of a laminated structure can be employed if desired. When laminated structures are used, the layer of the laminate closest to the first part 20 of substrate 10 should have the properties discussed herein for a second substrate 70 composed of a single polymer. Layers further from the first part 20 of substrate 10 could also have those properties, but may alternatively have relaxed properties because they do not directly interact with the first part 20 of substrate 10. In the latter case, the second substrate 70 is considered to have terminated when the properties specified for a second substrate 70 are no longer satisfied.

Along these same lines, either or both of substrates 10 and 70 can include surface layers over part or all of their external surfaces, e.g., an oxide layer on the semiconductor. When present on surface 12 of substrate 10 and/or surface 72 of second substrate 70, such surface layers should not have a composition and/or a thickness which will prevent the formation of a strong bond between the first and second substrates 10 and 70, respectively. In particular, an oxide layer on the surface 12 of substrate 10 having a thickness greater than about 100 nanometers can lead to weak or no bonding with the polymer substrate.

Subsequent to heat treatment, the first external surface 12 of the first substrate 10 is placed into contact with the bonding surface 72 of the second substrate 70. In one embodiment, when transferring the first substrate 10 from the support 60 to the substrate 70, care is taken in handling the first substrate 10 so as not to damage the possibly delicate heat-treated substrate 10. In one embodiment, prior to contacting said first substrate 10 with said second substrate 70, second substrate 70 is preheated to, and maintained at, a temperature suitable to effectuate adherence of the bonding surface 72 of the second substrate 70 to the first external surface 12 of the first substrate 10.

Figure 4:
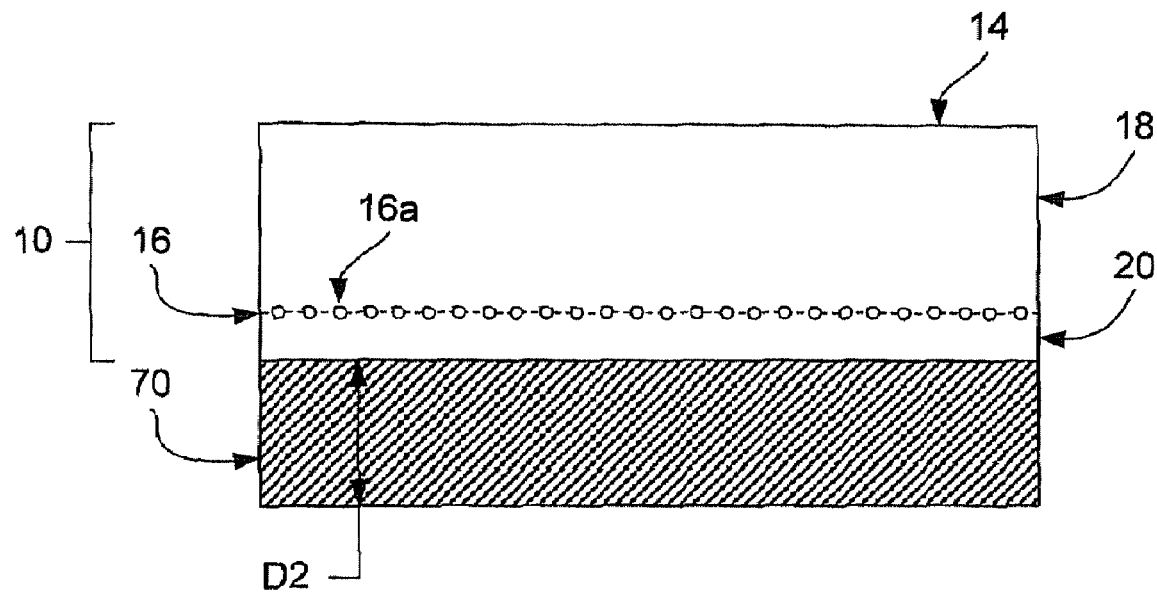
FIG. 4 is a cross-sectional view of a heat-treated ion-implanted substrate contacting a second substrate.

Now referring to FIG. 4, an assembly 80 comprising the first substrate 10 and second substrate 70 are contacted for a period of time and at a temperature and pressure effective to adhere the heat-treated, ion-implanted substrate 10 to the second substrate 70. The temperature required to adhere the first external surface 12 of substrate 10 to the bonding surface 72 of the second substrate 70 varies, depending on the composition of the bonding surface 72 of the substrate 70. Where bonding surface 72 is a polymer, typically the temperature is within plus or minus about 100° C. of the glass transition temperature of the polymer. In one embodiment, the only heat supplied during this step is that supplied to the second substrate 70 during preheating.

In one embodiment, some amount of force is applied to the second external surface 14 and force-applying surface 74 to urge the first external surface 12 and the bonding surface 72 together during this step. The specific pressure value to be used for any particular application of the invention can be readily determined by persons skilled in the art from the present disclosure. In general, the amount of pressure that may be applied is in the range of from about 0 psi to about 3 psi, and in one embodiment about 1 psi. The amount of time required to form a bond between first external surface 12 and the bonding surface 72 may range from about one minute to about 60 minutes, or in another embodiment from about 20 minutes to about 40 minutes, and in yet another embodiment about 30 minutes. After a suitable period of time, the heat, which as mentioned may be applied only to heat the second substrate 70, is discontinued and the assembly is cooled to a common temperature such as room temperature. Any pressure applied to the assembly 80 is removed.

In an alternative embodiment, adhesive is used to adhere the heat-treated ion-implanted substrate 10 to the second substrate 70. Suitable adhesives known to those having ordinary skill in the art for adhering semiconductor material such as SCS to polymeric materials, such as but not limited to silane adhesives, may be employed to this end.

Figure 5:
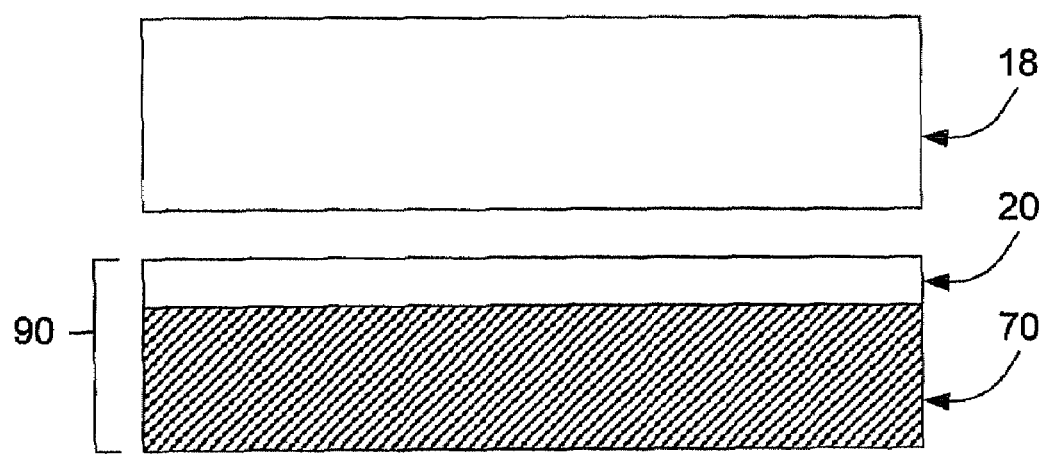
FIG. 5 is a cross-sectional view delineating exfoliation in accordance with the present invention.

Now further referring to FIG. 5, the first part 18 and second part 20 are separated at the separation zone 16, resulting in a structure 90 comprising second part 20 of first substrate 10 and second substrate 70. It is believed that during cooling, thermal stresses caused by a difference in a thermal expansion coefficient between first and second substrates 10 and 70, respectively, permit separation of the second part 20, which preferably comprises a thin semiconductor film, from the first part 18 and adherence to the substrate 70. Because of the weakening of the separation zone 16 which occurs during cooling, this separation can be performed without disturbing the bond between the second part 20 and the second substrate 70 or damaging the second part 20 or the second substrate 70.

In many cases, the separation involves merely moving the first and second parts 18 and 20 of the first substrate 10 away from one another, since during the cooling, those parts will have become completely free of one another. In some cases, a slight peeling action, like that used to remove household plastic wrap from a smooth object, is used at the end of the cooling to separate the two parts, but more than this is not needed because of the differential contraction of the first and second substrates and the resulting weakening of the separation zone 16.

The separation will typically result in part of separation zone 16 remaining associated with the first part 20 of the first substrate 10 and with part ending up associated with the second part 18. Depending upon processing conditions and ultimate end use, these surfaces of the first and second parts 18 and 20 produced by this separation, i.e., the exfoliation surfaces, may be useable as is or may require subsequent treatments, e.g., polishing, etching, doping, etc., prior to use. For example, prior to reuse as a first substrate 10 in another iteration of the overall process, the exfoliation surface of first part 18 may be subjected to conventional touch polishing to provide a sufficiently smooth surface for bonding to a new second substrate 70. Such polishing or other surface treatments may also be appropriate for the exfoliation surface of the second part 20 prior to its use in the manufacture of a thin film transistor or other electronic device.

The present invention as described can be practiced using a single first substrate 10 and a single second substrate 70. Alternatively, the methods of the invention can be used to form more than one SOI structure on a single second substrate 70. For example, methods in accordance with the invention can be used to dispose a first substrate 10 onto the second substrate 70 which does not cover the entire area of the second substrate 70. Thereafter, the methods of the invention may be repeated as necessary to dispose further substrate(s) 10 which cover all or part of the area not covered by the first-disposed substrate 10. The subsequent substrate 10 additions may be the same or different from the first substrate 10, e.g., said substrate(s) 10 can be made using a first substrate composed of a substantially single-crystal semiconductor material that is the same or different from the semiconductor material of the first substrate 10 used in producing the first SOI structure.

In another embodiment, multiple SOI structures may be formed simultaneously on a single second substrate 70 by providing multiple (i.e., two or more) first substrates 10, bringing all of those first substrates 10 into contact with a single second substrate 70, and then performing subsequent steps in accordance with the methods of the invention on the resulting multiple first substrate/single second substrate assembly. The multiple first substrates 10 can all be the same, all different, or some the same and some different.

Whichever approach is used, the resulting multiple SOI structures on a single polymer substrate can be contiguous or separated as appropriate for the particular application of the invention. If desired, gaps between some or all of the adjacent structures can be filled with, for example, semiconductor material to obtain one or more continuous semiconductor layers on a polymer substrate 70 of any desired size.

In accordance with the present invention, devices 90 composed of SCS films on polymer substrates are flexible, more damage resistant than devices using glass substrates and of low density, with superior performance to that provided in amorphous or poly-Si based TFTs. It is believed devices in accordance with the present invention are particularly useful in OLED based displays because of the increased stability and high current capability provided by SCS based devices.

Example 1

In this Example, an SCS film is transferred to a polymer substrate in accordance with the present invention. A boron-doped SCS wafer, with a resistivity of 1-10 ohm-cm and thickness of about 500 microns was hydrogen ion-implanted at 100 KeV and $8 \times 10^{16}$ ions/cm$^2$ dosage. The ion-implanted silicon wafer was heat-treated in air at 450° C. for about one hour on a smooth glass support and then allowed to cool to about room temperature. A polysulfone film with a thickness of about 1 millimeter was placed on a surface heated to about 225° C. and the film was allowed to heat to temperature. The cooled silicon wafer was carefully removed from the smooth glass support and placed on the heated polysulfone film, with the implanted side of the silicon wafer contacting the polysulfone film. A load of about 1 psi was placed on the silicon wafer and polysulfone film for about 30 minutes. The heat was turned off and the silicon wafer and polysulfone film were allowed to cool to about ambient temperature, at which time the load was removed.

The silicon wafer and polysulfone film could be easily separated, leaving a thin SCS film adhered to the polysulfone film.

Example 2

For comparison, an attempt was made to transfer an SCS film to a polymer substrate without first heat-treating the ion-implanted silicon wafer on a smooth glass support. In this example, the silicon wafer was implanted as in Example 1. A polysulfone film with a thickness of about 1 millimeter was placed on a surface heated to 225° C. and allowed to heat up to temperature. The ion-implanted silicon wafer was placed on the polysulfone film with the implanted side of the silicon wafer contacting the polysulfone film. A small load of about 1 psi was placed on the silicon wafer and polysulfone film. The temperature was maintained at about 225° C. for about 30 minutes. The silicon wafer and polysulfone film were allowed to cool to about ambient temperature and the load was removed.

It was found that the silicon wafer and polysulfone film were very strongly bonded and difficult to separate. In forcing the samples apart, the silicon wafer broke, leaving chunks of the wafer bonded to the polysulfone film. This result shows that merely bringing an ion-implanted silicon wafer and a polymer substrate into contact and increasing the temperature does not allow an incipient SCS film to transfer to the polymer substrate.

It will become apparent to those skilled in the art that various modifications to the preferred embodiment of the invention as described herein can be made without departing from the spirit or scope of the invention as defined by the appended claims.

The invention claimed is:

1. A process for transferring a semiconductor film to a polymer substrate to make a flexible semiconductor material comprising the steps of:
    implanting ions to a predetermined depth in at least one semiconductor substrate to create a separation zone within the at least one semiconductor substrate, the separation zone defining a first part and a second part of the at least one semiconductor substrate;
    heat-treating the at least one ion-implanted semiconductor substrate for a period of time and at a temperature effective to cause defect formation in the region of the implanted ions without separating the first part of the at least one semiconductor substrate from the second part of the at least one semiconductor substrate;
    cooling the at least one ion-implanted semiconductor substrate;
    preheating at least one polymer substrate to a bonding temperature of about plus or minus 100° C. of the glass transition temperature of the polymer substrate;
    contacting the first part of the at least one ion-implanted, heat-treated and cooled semiconductor substrate to the at least one preheated polymer substrate while heating only the at least one polymer substrate during the contacting step to maintain the preheated substrate at the bonding temperature, while the at least one ion-implanted substrate remains unheated other than by heat from the preheated polymer substrate, thereby (a) adhering the first part of the at least one ion-implanted, heat-treated semiconductor substrate to at least one polymer substrate and (b) separating the first part of the at least one semiconductor substrate from the second part of the at least one semiconductor substrate along the separation zone, whereby the second part of the at least one semiconductor wafer forms a semiconductor film bonded to the at least one polymer substrate.

2. The process of claim 1, wherein the step of implanting ions comprises implanting hydrogen ions.

3. The process of claim 1, wherein the step of implantation ions comprises implanting ions at a dose from about $1 \times 10^{16}$ ions/cm$^2$ to about $3 \times 10^{17}$ ions/cm$^2$ at about 10 KeV to about 200 KeV.

4. The process of claim 1, wherein the step of heat-treating the ion-implanted semiconductor substrate further comprises contacting the ion-implanted surface of the semiconductor substrate to a support.

5. The process of claim 4, the support comprising a material capable of withstanding temperatures above 500° C. without deformation.

6. The process of claim 4, the support comprising glass.

7. The process of claim 1, wherein the step of heat treating the ion-implanted semiconductor substrate comprises heating the ion-implanted substrate to a temperature of from about 300° C. to about 500° C.

8. The process of claim 1, wherein the step of heat treating the ion-implanted semiconductor substrate comprises heating the ion-implanted substrate to a temperature of from about 400° C. to about 500° C.

9. The process of claim 1, wherein the step of heat treating the ion-implanted semiconductor substrate comprises heating the ion-implanted substrate to a temperature of about 450° C.

10. The process of claim 1, wherein the step of heat treating the ion-implanted semiconductor substrate comprises heating the ion-implanted substrate for about 1 minute to about 120 minutes.

11. The process of claim 1, wherein the step of heat treating the ion-implanted semiconductor substrate comprises heating the ion-implanted substrate for about 30 minutes to about 90 minutes.

12. The process of claim 1, wherein the step of heat treating the ion-implanted semiconductor substrate comprises heating the ion-implanted substrate for about 60 minutes.

13. The process of claim 1, the semiconductor film comprising a substantially single crystal silicon film.

14. The process of claim 1, wherein the adhering step comprises positioning an adhesive between the semiconductor substrate and polymer substrate.

15. The process of claim 14, wherein the adhesive comprises a silane adhesive.

16. The process of claim 14, wherein the polymer substrate comprises a polymer chosen from the group comprising polysulfone, polyethylene terephthalate (PET), polyethylene naphthalate (PEN), and polyimides.

17. The process of claim 1, wherein the polymer substrate comprises a polymer selected from the group comprising thermoplastic polymers, thermoset polymers with high failure strain, glass-polymer blends and polymer coated with a glass film.

18. The process of claim 1, wherein the polymer substrate comprises polyethylene terephthalate heated to a temperature of about 242° C. to about 442° C.

19. The process of claim 1, wherein the polymer substrate comprises polysulfone heated to a temperature of about 85° C. to about 285° C.

20. The process of claim 1, wherein the contacting step is maintained for a period of time in the range of from about 1 minute to about 60 minutes.

21. The process of claim 1, wherein the contacting step is maintained for a period of time in the range of from about 20 minute to about 40 minutes.

22. The process of claim 1, wherein the contacting step further applying a pressure of about 3 psi or less to one of the at least one polymer substrate and the at least one ion-implanted semiconductor substrate to urge the two substrates together.

23. A method for producing a semiconductor-on-polymer structure comprising the steps of:
providing a first substrate comprising at least one semiconductor material having a first bonding surface and a first force-applying surface, and an internal separation zone for separating the first substrate into a first part and a second part, and the second part is between the separation zone and the first bonding surface;
heating the first substrate to weaken the separation zone and facilitate later delamination of the second part from the first part along the separation zone;
cooling the first substrate;
providing a second substrate comprising at least one polymer and further comprising two opposing external surfaces comprising a second bonding surface and a second force-applying surface;
heating the second substrate to a bonding temperature of about plus or minus 100° C. of the glass transition temperature of the polymer substrate;
contacting the first bonding surface of the cooled first substrate and the second bonding surface of the second substrate while heating only the second substrate to maintain the second substrate at the bonding temperature for a period of time sufficient for the first and second substrates to bond to one another at the first and second bonding surfaces to form an assembly and separate the first part and the second part of the first substrate along the an internal separation zone while the first substrate remains unheated other than by heat from the second substrate;
discontinuing the heat applied to the second substrate;
cooling the assembly; and
moving the first and second parts away from each other at the separation zone.

24. The method in accordance with claim 23, the first bonding surface, the first force-applying surface and the separation zone being substantially parallel to one another.

25. The method in accordance with claim 23, wherein the first substrate comprises a glass substrate.

26. The method in accordance with claim 23, wherein the semiconductor material comprises at least one single crystal silicon film.

27. The method in accordance with claim 23, wherein the contacting step further comprises applying a force to the first and second force-applying surfaces to urge the first and second bonding surfaces together.

28. A process for transferring a semiconductor film to a polymer substrate to make a flexible semiconductor material comprising the steps of:
implanting ions to a predetermined depth in at least one semiconductor substrate to create a separation zone within the at least one semiconductor substrate, the separation zone defining a first part and a second part of the at least one semiconductor substrate;
heat-treating the at least one ion-implanted semiconductor substrate for a period of time and at a temperature effective to cause defect formation in the region of the implanted ions without separating the first part of the at least one semiconductor substrate from the second part of the at least one semiconductor substrate;
cooling the at least one ion-implanted semiconductor substrate;
preheating at least one polymer substrate to a bonding temperature of about plus or minus 100° C. of the glass transition temperature of the polymer substrate; and
contacting the first part of the at least one ion-implanted, heat-treated and cooled semiconductor substrate to the at least one preheated polymer substrate thereby (a) adhering the first part of the at least one ion-implanted, heat-treated semiconductor substrate to at least one polymer substrate and (b) separating the first part of the at least one semiconductor substrate from the second part of the at least one semiconductor substrate along the separation zone, whereby the second part of the at least one semiconductor wafer forms a semiconductor film bonded to the at least one polymer substrate;
wherein the preheating step is stopped prior to the contacting step and no heat is applied to either the at least one ion-semiconductor substrate or the polymer substrate during the contacting step.

* * * * *